United States Patent
Komoto et al.

[11] Patent Number: 5,841,177
[45] Date of Patent: Nov. 24, 1998

[54] MULTICOLOR LIGHT EMITTING DEVICE

[75] Inventors: Satoshi Komoto, Tokyo; Toshiaki Tanaka; Norio Fujimura, both of Fukuoka-ken, all of Japan

[73] Assignee: Kabushiki Kaisha Toshiba, Kawasaki, Japan

[21] Appl. No.: 890,927

[22] Filed: Jul. 10, 1997

Related U.S. Application Data

[63] Continuation of Ser. No. 525,071, Sep. 8, 1995, abandoned, which is a continuation of Ser. No. 264,365, Jun. 23, 1994, abandoned.

[30] Foreign Application Priority Data

Jun. 25, 1993 [JP] Japan .................................. 5-155177

[51] Int. Cl.$^6$ ........................... H01L 27/14; H01L 31/00; H01L 33/00; H01L 27/15
[52] U.S. Cl. .............................. 257/431; 257/88; 257/81; 257/89; 257/95; 257/99; 257/100
[58] Field of Search .............................. 257/431, 88, 81, 257/89, 95, 98, 99, 100, 433

[56] References Cited

U.S. PATENT DOCUMENTS 5,266,817  11/1993  Lin ............................................ 257/89

FOREIGN PATENT DOCUMENTS

| | | | |
|---|---|---|---|
| 5-882581 | 5/1983 | Japan | 257/98 |
| 5882581 | 5/1983 | Japan | 257/98 |
| 61-163673 | 7/1986 | Japan | 257/98 |
| 4-137772 | 5/1991 | Japan | 257/89 |
| 3-171681 | 7/1991 | Japan | 257/89 |
| 3-179787 | 8/1991 | Japan | 257/98 |
| 4-137772 | 5/1992 | Japan | 257/89 |

*Primary Examiner*—Mahshid D. Saadat
*Assistant Examiner*—Jhihan B. Clark
*Attorney, Agent, or Firm*—Finnegan, Henderson, Farabow, Garrett & Dunner, L.L.P.

[57] ABSTRACT

A semiconductor light emitting device includes at least two semiconductor light emitting elements which emit different colors of light to each other. The device further includes a lead frame for supporting the light emitting elements and a resin molding for sealing these elements. The external form of this resin molding is an ellipsoid or a part of an ellipsoid in which the curvature in the perpendicular direction to the element row is designed to be smaller than that in the parallel direction to the row. As a result, the device has a widely spread mixed color range especially in the perpendicular direction to the element row and high luminous intensity especially in the parallel direction to the element row. So, a multicolor light emitting device having a high ability of color mixture as well as high luminous intensity can be obtained.

4 Claims, 4 Drawing Sheets

FIG.1A
(PRIOR ART)
FIG.1B
(PRIOR ART)
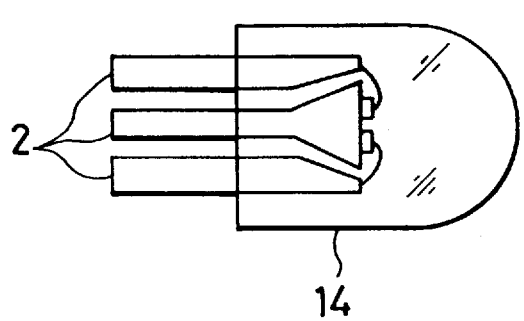
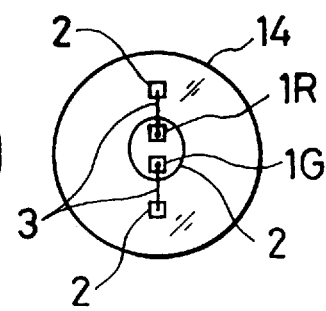
FIG.2A
(PRIOR ART)
FIG.2B
(PRIOR ART)
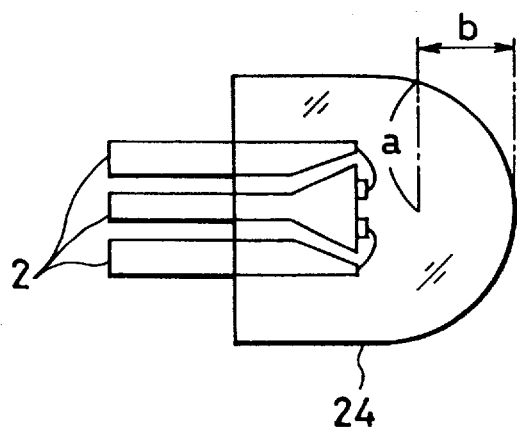
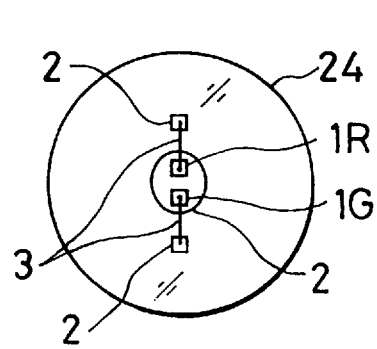

○ MIXED COLOR REGION OF THE DEVICE ACCORDING TO THE FIRST EMBODIMENT

□ LUMINOUS INTENSITY IN THE FRONT DIRECTION OF THE DEVICE ACCORDING THE FIRST EMBODIMENT

■ LUMINOUS INTENSITY IN THE FRONT DIRECTION OF THE DEVICE ACCORDING TO THE SECOND PRIOR ART

MULTICOLOR LIGHT EMITTING DEVICE

This is a continuation of application Ser. No. 08/525,071, filed Sep. 8, 1995 now abandoned; which is a continuation of application Ser. No. 08/264,365 filed Jun. 23, 1994, now abandoned.

BACKGROUND OF THE INVENTION

1. Field of the Invention

This invention relates to a multicolor light emitting device, and more particularly to a multicolor light emitting device having high ability of color mixture and high luminous intensity.

2. Description of the Prior Art

FIGS. 1a and 1b show the schematic structure of a light emitting device (LED lamp) according to the first example of prior art. As shown in these figures, the device is comprised of a plurality of light emitting elements 1R and 1G which are mounted on lead frames 2 and sealed with resin. As usual, the external form of this resin molding 14 is composed of a circular body in which the curvature in the direction perpendicular to the row of elements 1R and 1G is the same as that in the direction parallel to the row. In other words, the cross-sectional area of resin molding 14 is in form of a circle as shown in FIG. 1b.

In the LED lamp having the external form mentioned above, the respective lights emitted by elements 1R and 1G come out of this lamp in the different directions due to the lens effect of resin molding 14. This is because elements 1R and 1G are mounted on the different places of lead frame 2. It is, therefore, difficult physically to align the respective lights obtained from elements 1R and 1G in the same direction.

Accordingly, the respective lights of different colors are emitted from this LED lamp towards different directions. This greatly spoils the degree of color mixture of this lamp.

In order to solve the problem concerning about the color mixture, an LED lamp having the structure shown in FIGS. 2a and 2b has been proposed. In this lamp (the second prior art), resin molding 24 having a smaller curvature is used in order to avoid the directional dependence of the light intensity distribution. Specifically speaking, the sphere part of this lamp has a height b which is smaller than that of the lamp shown in FIGS. 1a and 1b. According to this structure, the mixed color range, in which the respective lights from elements 1R and 1G overlap to each other, becomes wider in the LED lamp shown in FIGS. 2a and 2b than that of the LED lamp shown in FIGS. 1a and 1b. Thus, the degree of color mixture of the lamp according to the second prior art is improved as compared with the lamp according to the first prior art.

However, the LED lamp of the second prior art still has the following disadvantage. That is, the intensity of light emission from this lamp decreases in the forward direction because the lens effect produced by the resin molding has become small due to its small curvature. As a result, light emission having required intensity could not be obtained from this lamp.

SUMMARY OF THE INVENTION

This invention has been made to overcome the above mentioned problems of the prior art light emitting devices.

Therefore, the objective of the present invention is to provide a multicolor light emitting device having high capability for color mixture as well as high luminous intensity.

In order to accomplish the above mentioned objective, the multicolor light emitting device of this invention has plurality of semiconductor light emitting elements for emitting at least two colors of light, a lead frame for supporting the elements, and a transparent resin molding for sealing said elements. The first feature of this invention is in that the curvature of said resin molding in the parallel direction to the row of said elements placed on said lead frame is designed to be smaller than the curvature in the perpendicular direction to said row.

In the second feature, said resin molding having the first feature is in form of an ellipsoid or a part of the ellipsoid, and the major axis of this ellipsoid is directed almost to the perpendicular direction to the row of said elements.

According to said first and second features of this invention, the curvature of the resin molding in the parallel direction to the element row becomes relatively small. Therefore, the intensity distribution of emitted lights becomes less dependent on directions. On the other hand, the curvature of the resin molding in the perpendicular direction to the element row becomes relatively large. So, the device of this invention can provide enough intensity of light emission without so much lowering the focusing effect produced by the lens which is made of the resin molding.

The third feature of the present invention is in that, in said resin molding, the ratio of diameter A, which is in the direction parallel to the element row, to diameter B, which is in the direction perpendicular to the element row, that is, A/B, is designed to be more than 1.2. In this case, the above mentioned advantage according to the first and second features is strongly emphasized.

These and other objectives, features, and advantages of the present invention will be more apparent from the following detailed description of preferred embodiments in conjunction with the accompanying drawings.

BRIEF DESCRIPTION OF THE DRAWINGS

FIG. 1a is a side view showing the structure of an LED lamp according to the first prior art;

FIG. 1b is a front cross-sectional view showing the structure of the LED lamp shown in FIG. 1a;

FIG. 2a is a side view showing the structure of an LED lamp according to the second prior art;

FIG. 2b is a front cross-sectional view showing the structure of the LED lamp shown in FIG. 2a;

FIG. 3b is a side view of the LED lamp shown in FIG. 3a, the view which is taken in the direction along the minor axis of the ellipse shown in FIG. 3a;

FIG. 3c is a side view of the LED lamp shown in FIG. 3a, the view which is taken in the direction along the major axis of the ellipse shown in FIG. 3a;

FIG. 4b is a side view of the LED lamp shown in FIG. 4a, the view which is taken in the direction along the minor axis of the ellipse shown in FIG. 4a;

DETAILED DESCRIPTION OF PREFERRED EMBODIMENTS

Figure 3A:
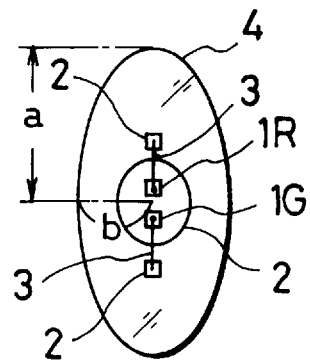
FIG. 3a is a front cross-sectional view showing the structure of an LED lamp according to the first embodiment of the present invention.
Figure 3B:
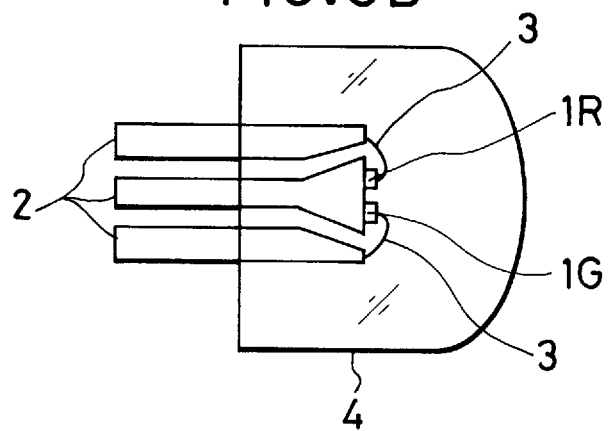
Figure 3C:
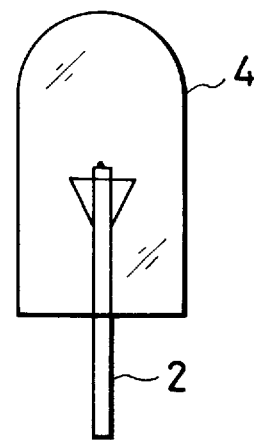

A light emitting device according to the first embodiment will be explained with referring to FIGS. 3a to 3c. In these figures, the same numbers as those shown in FIGS. 1 and 2 indicate the same or the similar structure elements. The front cross-sectional view of this lamp is shown in FIG. 3a. Also, the side view along the minor axis of the ellipse shown in FIG. 3a is illustrated in FIG. 3b and the side view along the major axis of this ellipse is illustrated in FIG. 3c.

As shown in these figures, the LED lamp of this embodiment is composed of a semiconductor light emitting element 1R for emitting red light, a semiconductor light emitting element 1G for emitting green light, a lead frame 2 for supporting elements 1R and 1G, and a resin molding 4 which is made from a transparent material and utilized to seal elements 1R and 1G. In addition, elements 1R and 1G are connected with lead frame 2 through gold wires 3.

The above mentioned LED lamp is fabricated in the following manner.

First, light emitting elements 1R and 1G are fixed respectively on lead frame 2 using conductive epoxy resin as an adhesive agent, and then, gold wires 3 are connected to these elements. For example, a GaAlAs or GaAsP light emitting diode is used as element 1R for emitting red light. Also, a GaP or InGaAlP light emitting diode is used as element 1G for emitting green light.

Thereafter, a mold is filled with transparent epoxy resin in a liquid state and the upper part of lead frame 2, the part where elements 1R and 1G are placed, is inserted thoroughly into the epoxy resin which will be hardened by applying heat. In this case, the inner surface of the mold is made in form of an ellipsoid so that the external form of resin molding 4 becomes an ellipsoid or a part of the ellipsoid.

Once the epoxy resin has been completely hardened, the resin molding 4 is taken out of the mold. Lastly, lead frame 2, which has been joined into one body so as to facilitate the fabrication process, is cut off into three parts, thus finishing up the LED lamp.

Figure 5A:
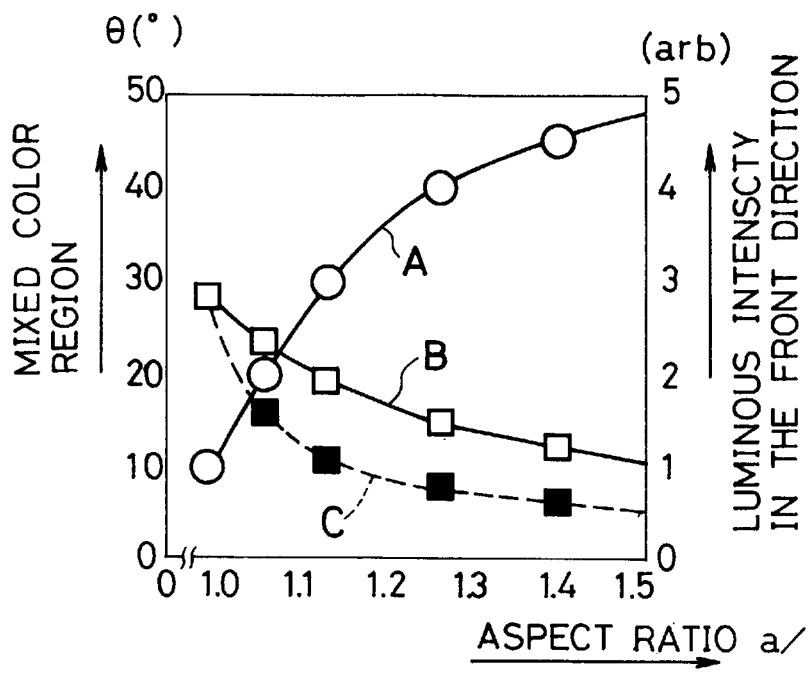
FIG. 5a is a graph for explaining the practical result of the improvement in the ability of color mixture of the LED lamp according to the first embodiment.

The practical result in the color mixture of lights will be described with respect to the LED lamp of this embodiment by referring to FIG. 5a. In FIG. 5a, curve A shows the relation between the mixed color region and the aspect ratio in the LED lamp of this embodiment, curve B shows the relation between the luminous intensity in the front direction and the aspect ratio in the LED lamp of this embodiment, and curve C shows the relation between the luminous intensity in the front direction and the aspect ratio in the LED lamp of the second prior art shown in FIGS. 2a and 2b.

The aspect ratio of this embodiment is obtained as the ratio between the curvatures of resin molding 4 in the direction parallel to the element row and in the direction perpendicular to this row. In other words, it is the ratio of a (a half of the major axis)/b (a half of the minor axis) in the ellipse shown in FIG. 3a. In the same manner, the aspect ratio of the second prior art device is obtained as the ratio of radius a of the circle shown in FIG. 2b to height b of the ellipsoid shown in FIG. 2b, that is, a/b. In this case, the radius a is set to be the same length as the length of a (a half of the major axis) in the ellipse shown in FIG. 3a.

Figure 5B:
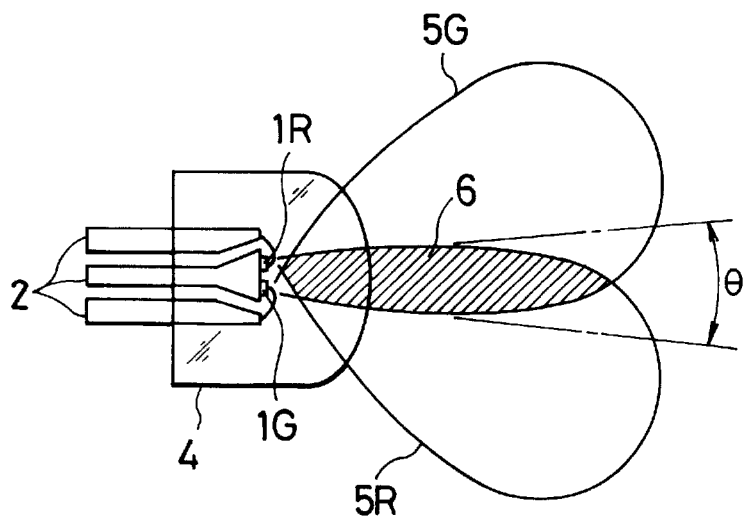
FIG. 5b is a view for illustrating the range of a mixed color region.

In addition, as shown in FIG. 5b, the mixed color region is defined by the angle θ° of the overlapped region 6 between emitting region 5R, which is from element 1R, and emitting region 5G which is from element 1G.

As is clearly understood from the characteristic curve A shown in FIG. 5a, the mixed color region 6 increases enormously as the aspect ratio increases. In particular, it is seen that the device has almost the complete ability of color mixture when the aspect ratio is more than 1.2.

Further, it is understood from the characteristic curves B and C that the luminous intensity in the front direction is greatly improved in the LED lamp of this embodiment as compared with the LED lamp of the second prior art.

Figure 4A:
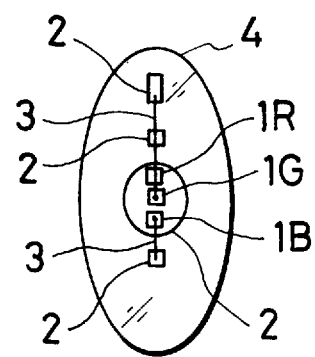
FIG. 4a is a front cross-sectional view showing the structure of an LED lamp according the second embodiment of the present invention.
Figure 4B:
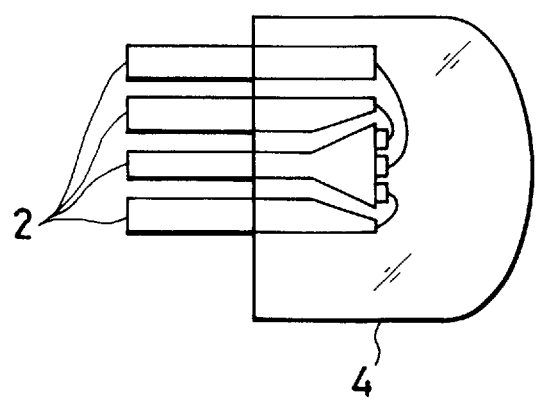

Next, the structure of an LED lamp according to the second embodiment is explained with referring to FIG. 4a, which is a cross-sectional view in the front direction, and FIG. 4b, which is a side view in the direction along the minor axis of the ellipse shown in FIG. 4a. The side view of this device in the direction along the major axis is the same as that shown in FIG. 3c.

As shown in FIGS. 4a and 4b, the LED lamp of this embodiment is composed of a semiconductor light emitting element 1R for emitting red light, a semiconductor light emitting element 1G for emitting green light, a semiconductor light emitting element 1B for emitting blue light, a lead frame 2 for supporting said elements 1R, 1G, and 1B, and a transparent resin molding 4 for sealing said elements. In this lamp, gold wires 3 connect elements 1R, 1G, and 1B with lead frame 2.

In an example, element 1R for emitting red light is made of GaAlAs or GaAsP, element 1G for emitting green light is made of GaP or InGaAlP, and element 1B for emitting blue light is made of SiC.

The lamp is fabricated in the similar manner as that of the lamp according to the first embodiment. In addition, the characteristics of this lamp is almost the same as those of the lamp in the first embodiment.

In summary, the light emitting device of this invention has a plurality of semiconductor light emitting elements for emitting at least two or three colors of light. These light emitting elements are sealed into a transparent resin molding which has an external form of an ellipsoid or a part of an ellipsoid whose major axis is almost parallel to the row of said elements. In addition, the curvature of the ellipsoid in the parallel direction to the element row is designed to be smaller than the curvature in the perpendicular direction to the element row. As a result, the curvature of the resin molding in the parallel direction to the element row becomes relatively small, thus reducing the directional dependency of the light intensity distribution in this light emitting device. On the other hand, the curvature of the resin molding in the perpendicular direction to the element row becomes relatively large. This allows the device of this invention to generate sufficient intensity of light without so much lowering the focusing effect against the emitted light, the effect which is arisen from the lens effect of the resin molding. As a result, a multicolor LED lamp, having not only high luminous intensity but high ability of color mixture, can be obtained according to the present invention.

What is claimed is:

1. A light emitting device, comprising:
   a plurality of semiconductor light emitting elements aligned in a row for emitting at least two different colors of light;
   a lead frame connected with said semiconductor light emitting elements for supplying electric energy to said semiconductor light emitting elements; and
   a transparent molding for sealing said semiconductor light emitting elements and providing an exterior convex ellipsoidal surface through which the light rays of said at least two different colors are passed, a cross section of said molding containing said light emitting elements being an ellipse having a major axis parallel to said row of semiconductor elements and a minor axis perpendicular to said row of elements, said exterior convex ellipsoidal surface having a long radius of exterior surface curvature in the direction of the major axis and a short radius in the direction of the minor axis, thereby to provide a region of enhanced color mixture of the light rays passed through the exterior convex ellipsoidal surface corresponding to a ratio of the long radius to the short radius.

2. The multicolor light emitting device as claimed in claim 1, including at least three spaced and aligned semiconductor light emitting elements, one of which emits red light, another of which emits green light, and the other of which emits blue light.

3. The multicolor light emitting device as claimed in claim 1, wherein said resin molding is so formed that the ratio of the long radius of exterior surface curvature in the direction parallel to the major axis, to the short radius in the direction of the minor axis, is more than 1.2.

4. The multicolor light emitting device as claimed in claim 3, wherein said at least three semiconductor light emitting elements include a GaAlAs or GaAsP light emitting diode for generating red light, a GaP or InGaAlP light emitting diode for generating green light, and a SiC light emitting diode for generating blue light.

* * * * *